(12) United States Patent
Marcomber et al.

(10) Patent No.: US 6,351,481 B1
(45) Date of Patent: Feb. 26, 2002

(54) DIODE LASER WITH SCREENING WINDOW AND METHOD OF FABRICATION

(75) Inventors: Steve Marcomber; Rushikesh Patel; Sheng-Hui Yang, all of Tucson, AZ (US)

(73) Assignee: Opto Power Corp, Tucson, AZ (US)

( * ) Notice: Subject to any disclaimer, the term of this patent is extended or adjusted under 35 U.S.C. 154(b) by 0 days.

(21) Appl. No.: 09/413,256

(22) Filed: Oct. 6, 1999

(51) Int. Cl.[7] .................................................. H01S 5/00
(52) U.S. Cl. ......................................................... 372/50
(58) Field of Search .............................. 372/43, 45, 46, 372/49, 50

(56) References Cited

U.S. PATENT DOCUMENTS 4,990,972 A * 2/1991 Satoh et al. .................. 357/17
5,208,823 A * 5/1993 Patel ............................ 372/50
5,729,563 A * 3/1998 Wang et al. .................. 372/50
5,745,514 A * 4/1998 Patel et al. ................... 372/43

* cited by examiner

*Primary Examiner*—James W. Davie
*Assistant Examiner*—Davienne Monbleau
(74) *Attorney, Agent, or Firm*—Herbert M. Shapiro

(57) ABSTRACT

The screening of edge-emitting laser diode bars in a production line is permitted by fabricating the source electrodes of each diode in the bar in two parts spaced apart to form a window aligned with the lasing cavity of the diode. Such windows have been made in failed devices to determine the cause of failure. Here, the windows are formed in a wafer stage of fabrication for later separation into laser bars or individual laser diodes. All wafers, all laser bars and all laser diodes are fabricated with windows thus permitting automatic screening during fabrication rather than opening a window to examine only failed devices as is the case in the prior art.

8 Claims, 4 Drawing Sheets

DIODE LASER WITH SCREENING WINDOW AND METHOD OF FABRICATION

FIELD OF THE INVENTION

This invention relates to laser diodes and more particularly to laser diodes which are fabricated in a manner to permit visual inspection during fabrication.

BACKGROUND OF THE INVENTION

High power edge emitting laser diodes are traditionally bonded, with the diode junction side down, onto a high thermal conductivity heatsink using solder. Once the devices are bonded down, visual inspection of the facets of the diodes is done. If a small void is seen under the emitting region at the diode-solder interface the device is usually rejected as there is higher thermal resistance at that location and the device is prone to early failure. The device is then tested for electrical and optical performance. If the device passes certain minimum requirements the device is usually put into burn-in for a fixed amount of time. Once the burn-in is completed, the degradation of device performance determines if the device would pass or fail.

The burn-in step helps in the elimination of infant failures. As the device ages under normal operating conditions, failures occur due to gradual degradation of the device crystal structure. This is due to defects in the crystal lattice like Dark Line Defect or Dark Spot Defect. These defects occur due to lattice mismatch or point defects or mechanical damage like a scratch on the diode surface. These types of defects may not show their existence during the normal burn-in screening procedure. Once the device is bonded to the heatsink there is no easy way to look at the junction side surface of the chip as it is embedded in the solder.

The existence of lattice defects has been investigated by various ways of which one was to look at the spontaneous emission coming out from the substrate side of the device. This has been done for surface emitting devices, where the laser emission occurs from the substrate side, by creating a window in the metal contact (usually n-contact). For edge emitting devices it is achieved by selectively removing the metallization on the substrate side (usually n-contact) opposite the contact region (p-side) which is bonded to the heatsink. This procedure of selective metallization removal for investigating the failure mechanism on an edge emitting device is done after the device has failed.

BRIEF DESCRIPTION OF THE INVENTION

In accordance with the principles of this invention screening techniques for infant failure mechanisms are improved by making use of the transparency properties of the substrate to the lasing or spontaneous emission. Specifically, an edge emitting device is fabricated with a window in the n-metallization region so that the optical characteristics all along the device cavity length can be compared before and after burn-in. Many lattice defects are more apparent after the device is subjected to electrical, thermal and optical stress. As these defects are regions of non-radiative recombination they show up as dark spots when the device is viewed with a camera sensitive to the emission wavelength. If a device is seen with these defects it may be rejected as the device is prone to early failure. This technique can be used to successfully eliminate device that may fail early in the field and result with product that has very high reliability. This technique can also reduce the time of burn-in required for very high reliability applications such as space communication and telecom where burn-in times sometimes in excess of one-thousand hours may be required.

DETAILED DESCRIPTION OF ILLUSTRATIVE EMBODIMENTS OF THIS INVENTION

Figure 1:
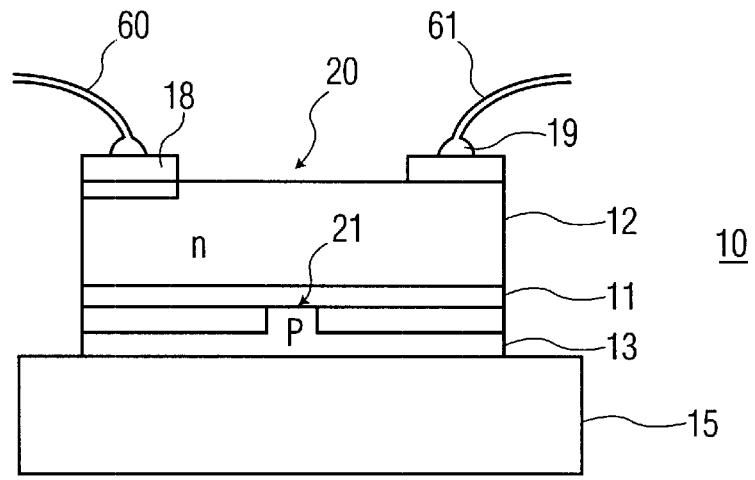
FIGS. 1 and 2 are schematic end and top views of a laser diode with a screening window in accordance with the principles of this invention.

FIG. 1 shows an edge-emitting laser diode 10 with a quantum well 11 defined in the usual manner in an n-type substrate 12. The familiar p-type layer 13 of the diode is bonded to heatsink 15. The top surface of substrate 12, as viewed, includes spaced-apart electrodes 18 and 19 forming window 20 therebetween. Window 20 extends over the entire lasing cavity 21.

Figure 2:
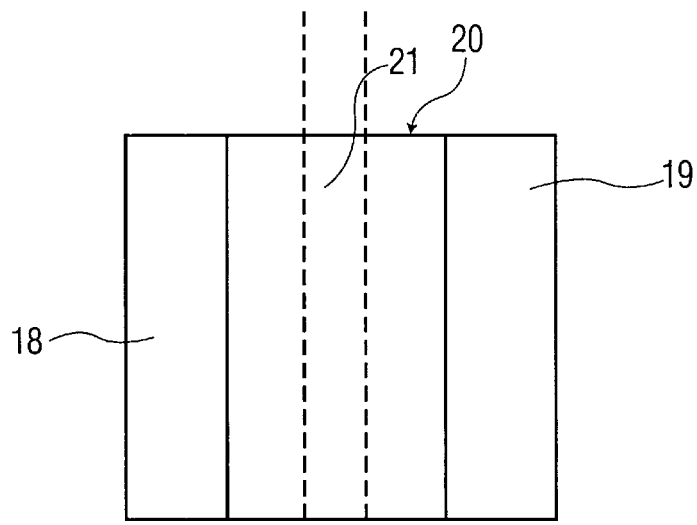
Figure 3:
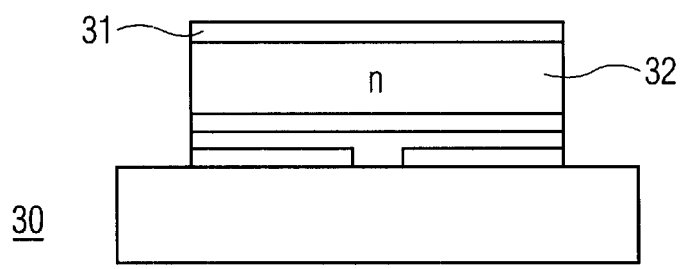
FIG. 3 is a schematic side view of a prior art edge emitting diode.

FIG. 3 shows a prior art edge-emitting laser diode 30. The diode is configured like that of FIG. 2 except that it has an electrode 31 extending over the entire top surface of n-type substrate 32 as viewed leaving no window for screening diodes during fabrication.

Figure 4:
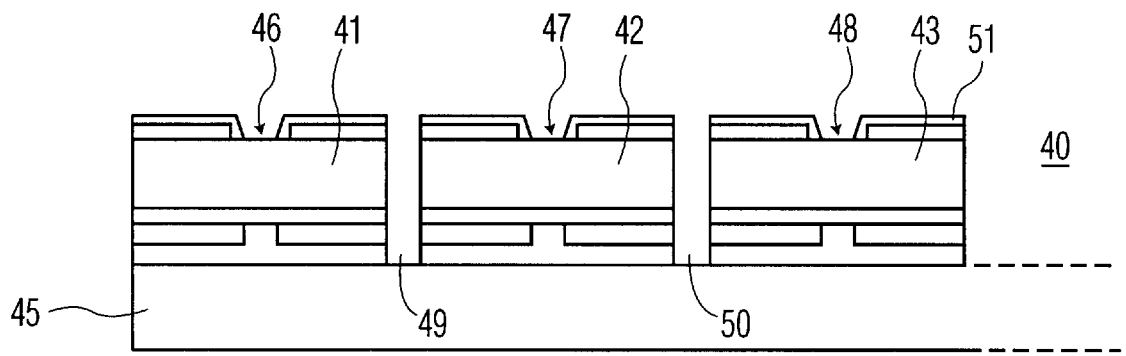
FIG. 4 is a schematic side view of a laser bar including a plurality of laser diodes each with a screening window.

FIG. 4 shows a laser bar 40 including a plurality of laser diodes 41, 42, 4—each bonded, p-side down, to a common heatsink 45. The diodes have screening windows 46, 47, 48—respectively and are shown separated physically and electrically by slots 49 and 50. The windows are formed through insulating layer 51 as shown.

Lead connections to the diode of FIG. 1 or to the diodes of the bar of FIG. 4 are attached as if electrodes 18 and 19 of FIG. 1 (or equivalent structures in FIG. 4) were a single electrode. That is to say, leads 60 and 61 of FIG. 1 are connected to a supply of current and the heatsink is connected to ground or to a reference voltage.

Figure 5:
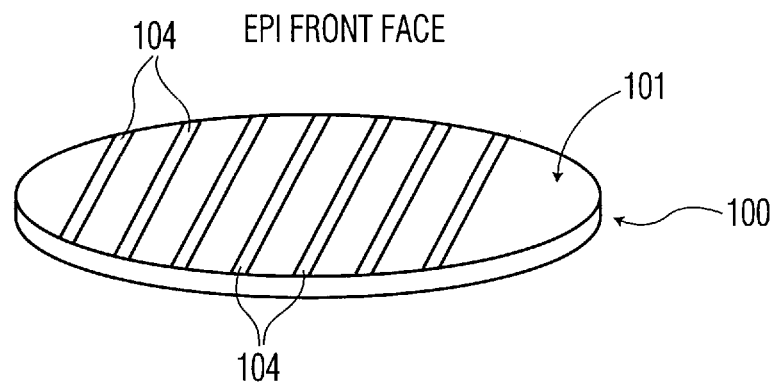
FIGS. 5 and 6 are schematic front and backside views, respectively, of a wafer from which the bar of FIG. 4 is obtained.
Figure 6:
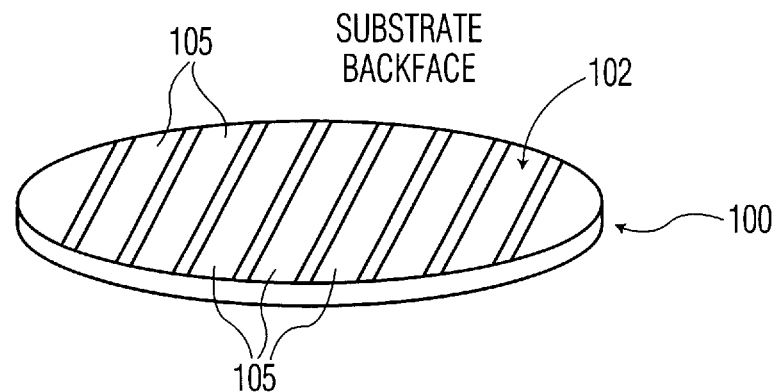

The laser bars of FIG. 4 are formed by dicing a wafer in which an array of devices is formed. FIG. 5 shows such a wafer 100 with the epi surface 101 (viz: the bottom surface of FIG. 4 as viewed) facing upwards. FIG. 6 shows wafer 100 with the substrate surface 102 facing upwards and the epi surface 101 facing downward. FIG. 5 shows the emitters regions 104 each corresponding to region 21 of FIG. 2. FIG. 6 shows windows 105 corresponding to window 20 of FIG. 2.

Figure 7:
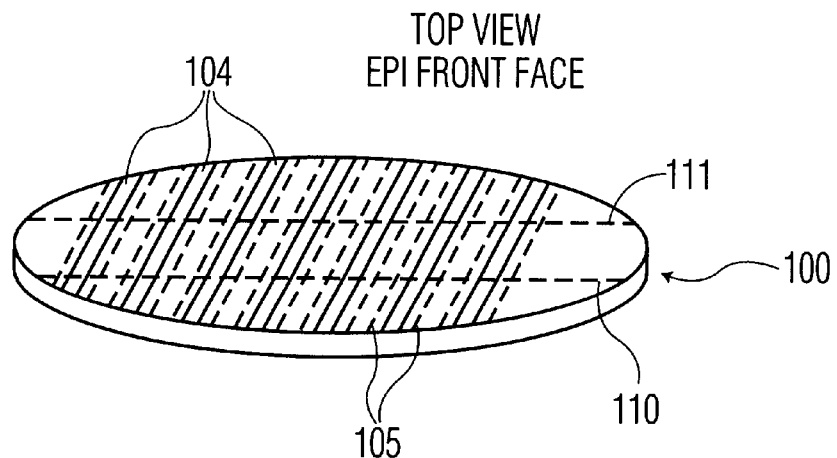
FIG. 7 is a schematic top view of the wafer of FIGS. 5 and 6 showing the alignment of screening windows and lasing cavities (emitters)

FIG. 7 shows wafer 100 with the epi face upwards as shown in FIG. 5 with the emitter regions 104 represented by solid lines and windows 105 represented by broken lines to illustrate the alignment of emitters and windows in the wafer to correspond to the alignment of the emitter and the window 20 and 21 of FIG. 2.

Figure 8:
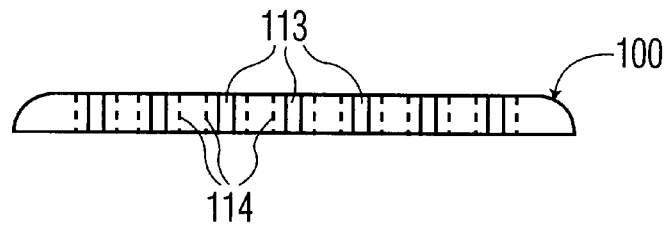
FIGS. 8 and 9 are schematic front and backface views of a laser bar cut from the wafer of FIG. 7.
Figure 9:
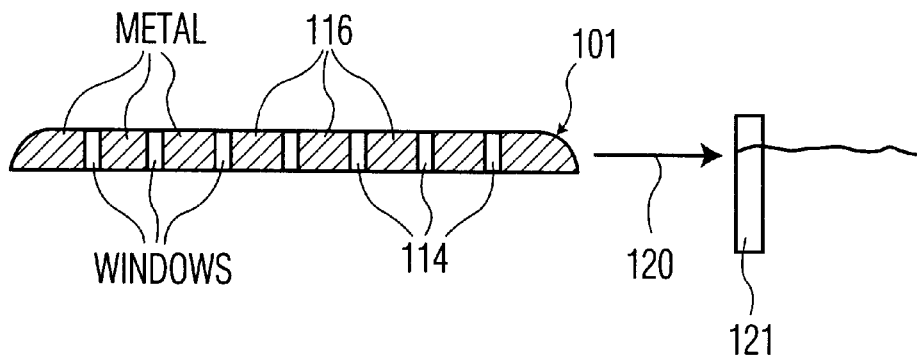

FIGS. 8 and 9 illustrate front and backface views of a laser bar diced out of the wafer of FIG. 7 along broken lines 110 and 111 in FIG. 7. The view of FIG. 8 is the same as that in FIG. 7. The view of FIG. 9 is the backside view of the laser bar of FIG. 8. The view of FIG. 8 shows emitters 113 and windows 114 (shown with broken lines). FIG. 9 shows that the windows are formed by spaces in metal layer 116 defined by photolithographic techniques. A bar made in this manner is amenable to automated inspection by, for example, moving the bar to the right as indicated by the arrow 120 part on inspection station 121 where an image of the lasing cavity may be captured and inspected.

Although windows have been opened to inspect failed devices (proceedings of the IEEE. Vol. 61(7).pp 1042–1044, July 1973), the fabrication of wafers with windows for permitting screening during manufacture as well as laser bars with screening windows represents a significant departure from prior art thinking.

Figure 10:
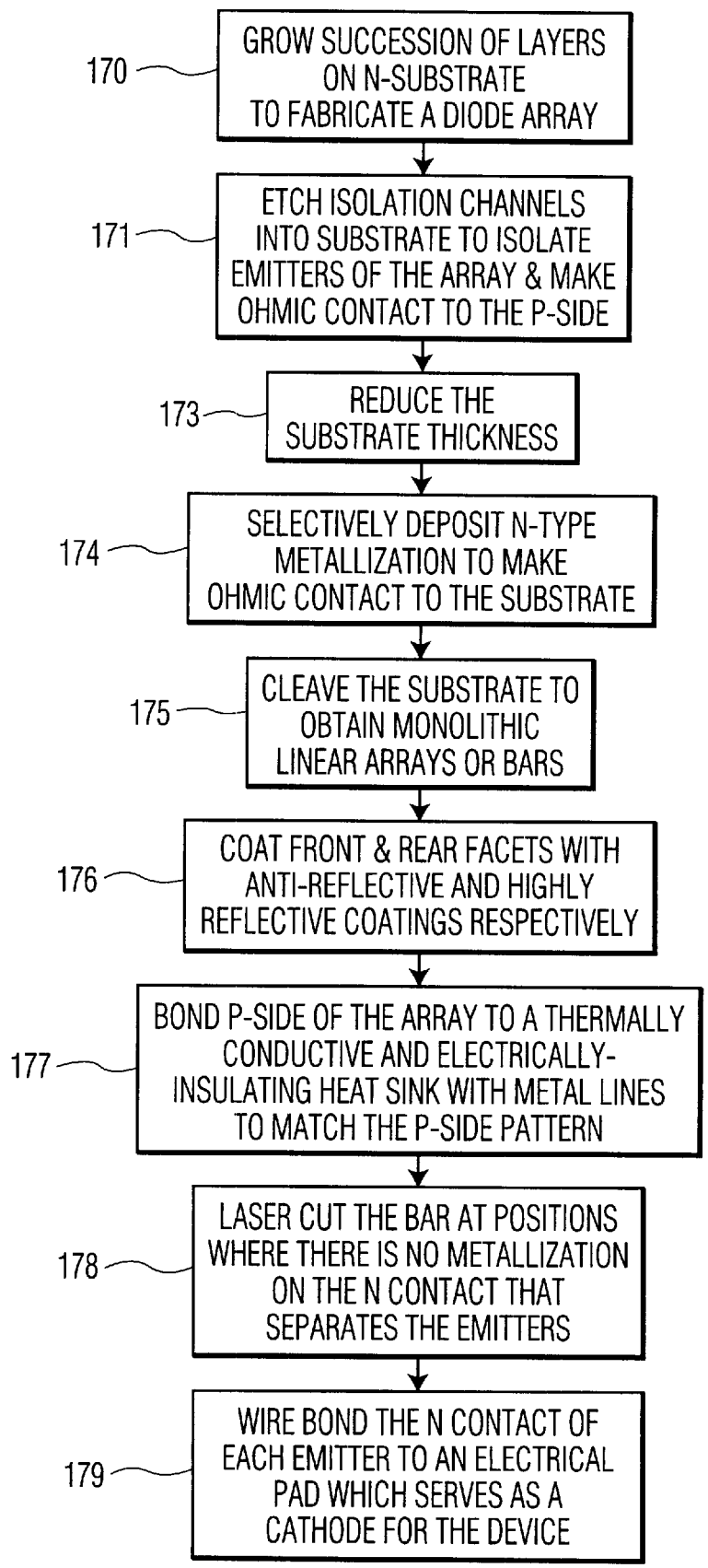
FIG. 10 is a flow diagram of the method for fabricating the device of FIGS. 1 and 2.

FIG. 10 is a flow diagram of the method of fabrication the laser diode bar of FIG. 4. Specifically, the usual succession of layers is grown on an n-type substrate as indicated by block 170 of FIG. 10. The growth order is an n-type buffer and cladding layer followed by an active layer sandwiched between two waveguide layers followed by a p-type cladding layer and a p++ contact layer. The emitters of the array are then separated by isolation channels, coated with insulation and ohmic contacts are made in windows opened in the insulation as indicated by block 171.

The thickness of the substrate is reduced to between 100 and 150 microns as indicated by block 173.

An n-contact metallization is deposited selectively to make ohmic contact to the n-type substrate as indicated by block 174. The n-contact metallization is absent opposite the pattern of the p-contact but sufficient to supply electrical current to the p-contact.

The substrate is then cleaved to obtain monolithic arrays or bars as indicated by block 175 and the front and rear facets of the emitters are coated with anti-reflective and highly reflective coatings respectively as indicated in block 176.

The p-side of an array (or bar) is bonded to a thermally conductive heatsink for a parallel arrangement of emitters or to a thermally conductive but electrically insulating heatsink with metal strips to match the p-metallization if the emitters are electrically in series or under independent current control. This step is indicated by block 177. The metal lines on the heatsink provide paths for current flow and, in some cases, enhance heat transfer. The metal lines also can be pre-deposited to improve bonding and ease assembly. If individual chips are required, the array can be diced to provide individual emitters which can be bonded to heat sinks.

For high power laser arrays, the bar is cut (illustratively using a laser) at positions where there is no metallization on the n-contact that separates the individual emitters. The laser removes only the n-type gallium arsenic (GaAs) substrate only. The active area is well protected because the junction is completely enclosed by dielectric, metal layers and optical coatings. No post wet processing is required because laser cutting is a clean dry process. This step is represented by block 178 of FIG. 10.

The n-contact of each emitter is bonded to an electrical pad that serves as a cathode for the device as indicated by block 179. The p-side contact becomes the anode contact. For an array where all the emitters are electrically in series, the wire bond from the n-contact of a first emitter is connected to the metal line which is bonded to the p-contact of the next emitter. If the emitters are to be controlled individually, each n-contact is wired to an individual pad that acts as a cathode for the emitters.

The width of the window opened in the n-contact electrode is limited to about the thickness of the substrate in order to have uniform current spreading. In test devices, that thickness is between 100 and 150 microns.

To monitor optical power one can attach a photodetector on the n-side such that it covers the lasing region of the emitter. This can be done after the screening procedure is complete. If lasing region has defects, there is non-radiative recombination which lowers the optical power of the spontaneous emission. As these regions grow in size the power drops. This provides another approach for running devices under constant power mode.

Advantages of Invention

1. The ability to inspect the entire lasing region of a semiconductor laser during fabrication. This enables one to screen devices that may have defects within the crystal lattice, as these are detrimental to the reliability of the device.
2. This technique can also reduce the time of burn-in required for very high reliability applications like telecom.
3. Higher reliability of linear arrays due to the combination of screening for lattice defects and serial electrical operation of emitters. Reliability of monolithic arrays now approaches that of single emitters.
4. Fabrication of multiple emitters on a monolithic substrate which dramatically reduces handling of multiple emitters.
5. This approach eliminates problems of optical alignments as all emitters are virtually in the same plane for alignment of optical components like fiber lenses. If individual emitters on individual heatsinks are done the optical alignment has to be done on an individual basis, while here a linear array of fibers can be easily aligned to a monolithic array by using a single fiber lens.
6. No damage to semiconductor occurs because the use of a laser results in no mechanical damage as would be generated by mechanical sawing operation.
7. Isolation of emitters is done using a laser, which is a dry process.
8. Lower drive currents of 0.05–10A. This is much preferable compared to prior art 10–200A from systems standpoint as smaller wires can be used. Typical operation depending on power level and number of emitters may require between 1–3A of current.
9. This approach of laser cutting and individual emitter isolation for high reliability can also be extended to a monolithic surface emitting two-dimensional array.
10. Devices can be fabricated to achieve constant power control using a monitor photo diode.

What is claimed is:

1. A wafer of semiconductor material comprising a substrate and a plurality of patterned epitaxial layers therein for defining an array of laser diodes, said array being organized in columns and rows, said wafer having a backface comprising said substrate surface and a frontface comprising a top one of said patterned epitaxial layers, said wafer including a plurality of emitters each aligned alone one of said columns, said backside including a layer of metal, said layer of metal coating said substrate surface except in areas aligned with said columns for forming windows there.

2. A wafer as in claim 1 including insulating material on said substrate surface in said area aligned with said columns and uncoated by said metal layer.

3. A wafer as in claim 1 wherein each of said areas aligned with said column has a thickness about equal to or less than the thickness of said substrate.

4. A wafer as in claim 3 wherein said substrate has a thickness of from 100 microns to less than about 150 microns.

5. A wafer as in claim 2 wherein said material comprises silicon dioxide.

6. A wafer as in claim 1 wherein said substrate comprises n-type gallium arsenic.

7. Wafer as in claim 1 wherein said n-type substrate comprises gallium arsenide and has a thickness of less than about 150 microns, said contacts being spaced apart a distance of less than about the thickness of said substrate.

8. A wafer bar as in claim 1 said bar including slots being adjacent emitters therein for isolating said emitters physically and electrically.

* * * * *

UNITED STATES PATENT AND TRADEMARK OFFICE
CERTIFICATE OF CORRECTION

PATENT NO.         : 6,351,481 B1                                          Page 1 of 1
APPLICATION NO. : 09/413256
DATED              : February 22, 2002
INVENTOR(S)       : Steven Henry Macomber, Rushikesh Patel and Sheng-Hui Yang It is certified that error appears in the above-identified patent and that said Letters Patent is hereby corrected as shown below:

Title page, item (75) should read as follows:

(75) Inventors:  Steven Henry Macomber; Rushikesh Patel;
                 Sheng-Hui Yang, all of Tucson, AZ (US)

Signed and Sealed this

Fourth Day of August, 2009

JOHN DOLL
*Acting Director of the United States Patent and Trademark Office*